United States Patent
Lim et al.

(10) Patent No.: US 7,187,176 B2
(45) Date of Patent: Mar. 6, 2007

(54) NMR PROBE CIRCUIT WITH NODAL IMPEDANCE BRIDGE

(75) Inventors: Yit Aun Lim, Boston, MA (US); Werner E. Maas, Boxford, MA (US)

(73) Assignee: Bruker Biospin Corp., Billerica, MA (US)

(*) Notice: Subject to any disclaimer, the term of this patent is extended or adjusted under 35 U.S.C. 154(b) by 88 days.

(21) Appl. No.: 11/053,452

(22) Filed: Feb. 8, 2005

(65) Prior Publication Data
US 2006/0176057 A1   Aug. 10, 2006

(51) Int. Cl.
*G01V 3/00* (2006.01)
(52) U.S. Cl. .................... 324/322; 324/318
(58) Field of Classification Search ........... 324/322, 324/318
See application file for complete search history.

(56) References Cited

U.S. PATENT DOCUMENTS 4,633,181 A * 12/1986 Murphy-Boesch et al. . 324/322
4,890,062 A * 12/1989 Haragashira ............... 324/322
5,036,426 A *  7/1991 Shen ........................ 361/329
5,861,748 A    1/1999 Schaefer et al.
6,617,851 B1 *  9/2003 Bergmann ................. 324/318
6,794,874 B2   9/2004 Hasegawa

OTHER PUBLICATIONS

F. David Doty, George Entzminger, Y. Andy Yang, Magnetism in High-Resolution NMR Probe Design. II: HR MAS; Concepts in Magnetic Resonance, vol. 10(4) 239-260 (1998).

* cited by examiner

Primary Examiner—Louis M. Arana
(74) Attorney, Agent, or Firm—Law Office Of Paul E. Kudirka

(57) ABSTRACT

A nuclear magnetic resonance (NMR) probe circuit is used with a sample coil tuned to a primary frequency $f_1$. The circuit is arranged to have a plurality of points of electric field minima at the $f_1$ frequency. One or more additional frequencies may be coupled to the circuit at these points, without interaction with $f_1$. The probe circuit also uses an impedance coupled between two of the minima points that affects the frequency response at the additional frequency or frequencies, without affecting the frequency response at $f_1$. The impedance may be made adjustable to allow tuning of the relative frequency resonances.

20 Claims, 3 Drawing Sheets

NMR PROBE CIRCUIT WITH NODAL IMPEDANCE BRIDGE

FIELD OF THE INVENTION

This invention relates generally to the field of nuclear magnetic resonance (NMR) spectroscopy and, more particularly, to an NMR probe circuit having multiple simultaneous resonant frequencies.

BACKGROUND OF THE INVENTION

In the field of NMR spectroscopy, a sample is surrounded by an NMR probe that consists of a radio frequency (RF) coil tuned to generate a field at a desired excitation frequency and receive a return NMR signal. More complex probes will generate multiple frequencies so as to excite the nuclei of more than one different element in the sample (e.g., hydrogen nuclei $^1$H (proton) and fluorine nuclei $^{19}$F). These "double resonance" probes (in the case of a probe generating two separate frequencies) and "triple resonance" probes (in the case of a probe generating three separate frequencies) have been used for many years, with varying degrees of success. One of the problems faced by multiple resonance probes arises when trying to adjust the response at one frequency without disturbing that of another.

In systems having a single sample coil, it is necessary to generate each of the desired resonant frequencies and apply them to the coil, and some form of frequency isolation is incorporated into the circuits themselves. Transmission line resonators have been used to produce high Q resonances with high power handling for NMR probes, particularly at high Larmor frequencies such as $^1$H and $^{19}$F. These resonators have nodes at which the electric field is at a minimum, and at these locations circuitry for lower nuclei resonances can be added without affecting the high frequency resonances. This allows a single sample coil to be used to excite an NMR sample at several isolated frequencies, as opposed to using double orthogonal coils to prevent mutual coupling between the resonances. A single sample coil has the advantage of improved sensitivity with higher filling factor and better power handling without inter-coil arcing. However, use of a single sample coil also has the disadvantage of efficiency tradeoffs between the high frequency and low frequency channels.

In existing systems, the resonant frequency of the sample coil determines the trade off between the efficiency of the high frequency (such as $^1$H) and low frequency (such as $^{13}$C or $^{15}$N) channels. Increasing the self resonance of the sample coil, either by reducing its inductance or capacitance, improves $^1$H efficiency while degrading the efficiency of a lower frequency. Decreasing the self-resonance of the sample coil has the opposite effect.

SUMMARY OF THE INVENTION

In accordance with the present invention, a nuclear magnetic resonance probe has an inductive sample coil that is resonant at a frequency $f_1$. A resonator circuit is electrically connected to the sample coil, and has a plurality of points of electric field minima for an RF signal at the frequency $f_1$. Thus, if $f_1$ is a relatively high frequency, such as that used for exciting hydrogen ($^1$H) nuclei, the sample coil may be resonant at $f_1$, and the resonator circuit may be arranged so as to provide accessible minima points for $f_1$. Such a resonator circuit may, for example, make use of transmission lines, such as quarter-wave or half-wave transmission lines, to create the desired minima points. An input port may be connected to one of the minima points of the resonator circuit so as to allow the connection of an electrical signal at a second frequency, $f_2$. At this point of insertion of the $f_2$ signal, there is no interaction with the $f_1$ signal, since it is an electrical iso-point for $f_1$. The probe also includes an impedance located between two of the minima that affects the frequency response of $f_2$, but has no effect on $f_1$.

The impedance located between the minima points may be adjustable, allowing the frequency response of $f_2$ to be adjusted. This may be an adjustable capacitor or an adjustable inductor, or some combination of capacitors and/or inductors with one or more adjustable components. Whether or not it is adjustable, the impedance may include a parallel combination of at least one capacitor and one inductor, or a series combination of at least one capacitor and one inductor, each of which will have a different effect on the frequency response of $f_2$, while still having no effect on the frequency response of $f_1$.

The impedance that is connected between two minima may be electrically in parallel with the sample coil, and the resonator circuit may be balanced such that an electric field minimum for $f_1$ is located at the center of the sample coil. The invention also provides for the introduction of more than one additional resonant frequency to the probe circuit and, like $f_2$, an additional frequency may be introduced at a minima point for $f_1$. Thus, while the sample coil may be tuned to $f_1$ (possible a high frequency, such as $^1$H), two additional frequencies may be added to create a triple resonance probe. In such a case, the input port mentioned above may be used to introduce a first of these additional frequencies to the resonator circuit at a minima point, and a second input port may also be used to introduce another signal at a different frequency, $f_3$. With an impedance connected between two of the minima points, the impedance would have an effect on the resonant frequency of both $f_2$ and $f_3$, while not disturbing $f_1$. If the impedance is adjustable, it can be used to simultaneously change the frequency response at both $f_2$ and $f_3$, without affecting $f_1$.

BRIEF DESCRIPTION OF THE DRAWINGS

The above and further advantages of the invention may be better understood by referring to the following description in conjunction with the accompanying drawings in which.

DETAILED DESCRIPTION

Figure 1:
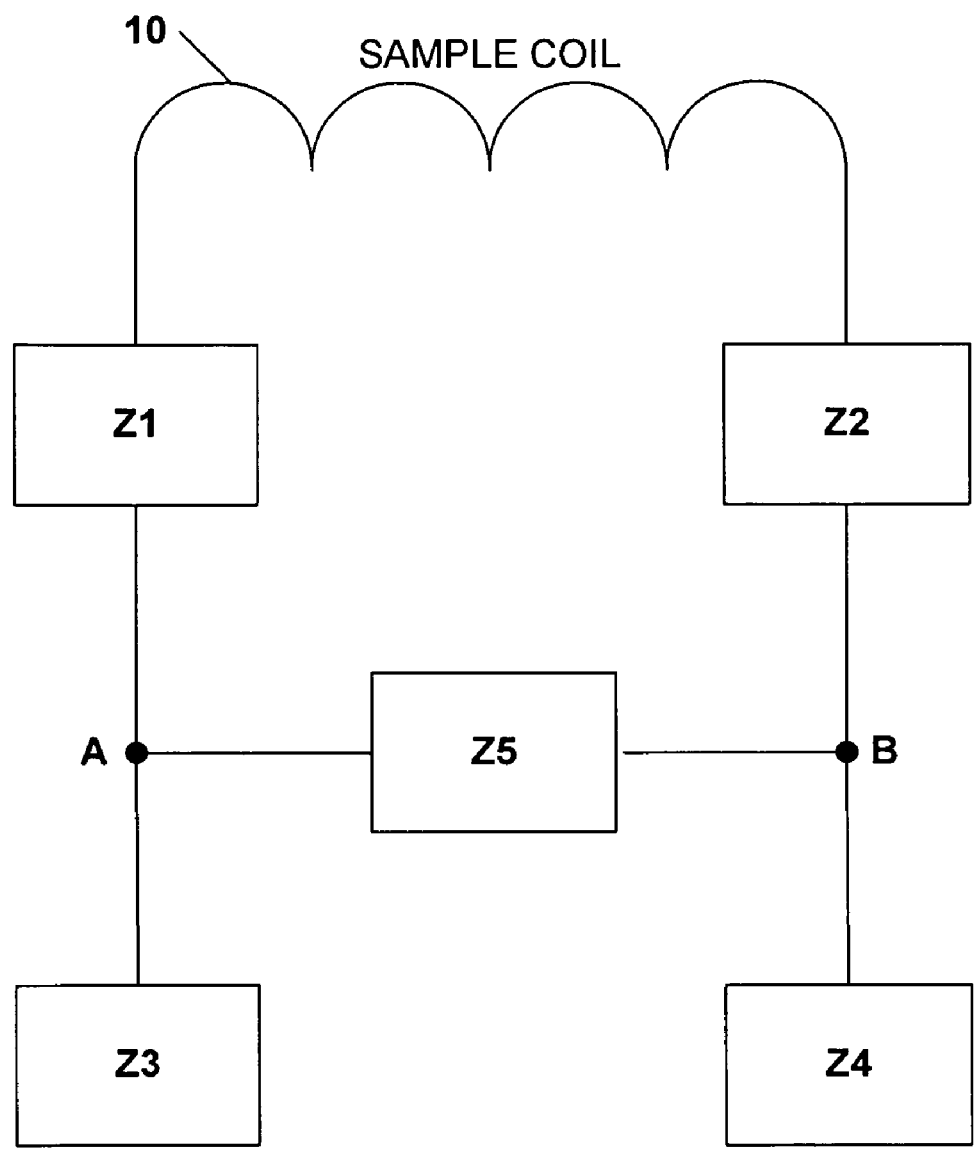
FIG. 1 is a schematic view of a probe circuit according to the present invention.

Shown in FIG. 1 is a block diagram depicting the general architecture of a probe circuit according to the present invention. A conventional sample coil 10 is in close proximity to a sample location, and provides the NMR excitation signal as well as detects the sample response. Connected to opposite sides, respectively, of the sample coil are impedances Z1 and Z3, and Z2 and Z4. These impedances are connected in series with the sample coil to produce electric field maxima on either end of the coil, and mimina at the center of the coil. This symmetry provides a balanced magnetic field maximum in the center of the sample coil to excite the sample.

With appropriate selection of circuit elements or resonators, electric field minima at a primary frequency can also be created at points between the impedances Z1 and Z3 and between the impedances Z2 and Z4. These points are labeled in FIG. 1 as point A and point B, respectively. For the primary frequency in question, points A and B represent electrical iso-points, or points of equi-phase and equi-potential for those frequencies. These points can therefore be used to connect additional channels to the probe circuit to allow excitation of the sample at those other frequencies via sample coil 10.

In practice, Z1 and Z2 may be realized using quarter wavelength (or odd multiples of it) transmission lines relative to the primary frequency. Z3 and Z4 may also be realized using quarter wavelength (or odd multiples of it) transmission lines with open-ended terminations at the ends opposite points A and B, as well as by using half wavelength (or multiples of it) transmission lines relative to the primary frequency, with ground terminations at the ends opposite point A and B. Of course, all of these impedances may also be formed using other types of components that are electrically equivalent to the transmission lines.

Since points A and B represent electric field minima for the primary resonant frequency of the coil, the potential difference between point A and point B is zero for that frequency. In the present invention an additional impedance Z5 is located between these points to affect the response at the frequencies of the additional channels. Since this additional impedance has no effect on the response for the primary frequency, it allows modification of the response for the secondary frequencies without adversely affecting the primary frequency. Z5 may be a capacitor or inductor, or any combination of circuit components, and may include tuning elements such as a trimmer, depending on the desired response of the additional channels.

Figure 2:
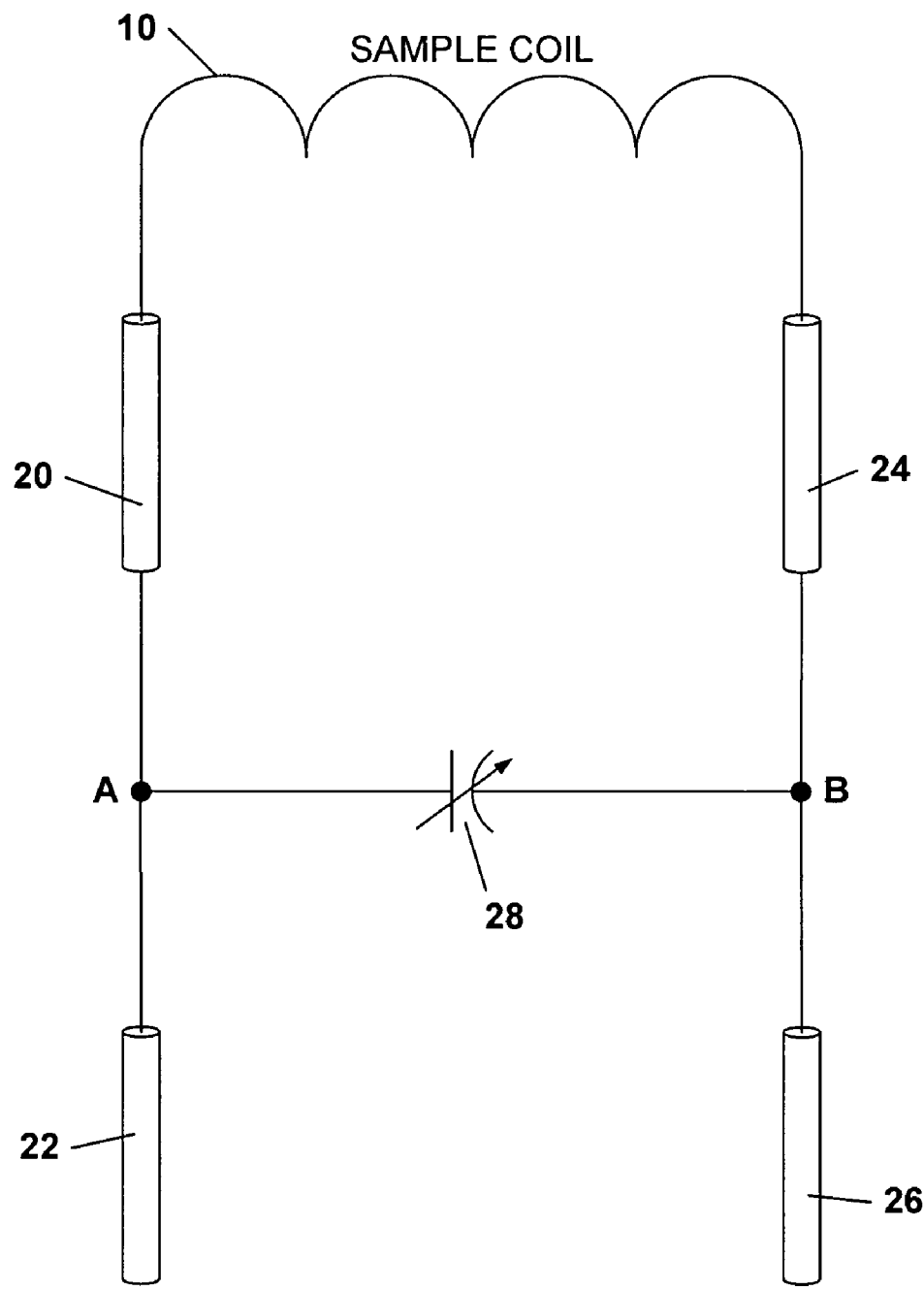
FIG. 2 is a schematic view of a probe circuit like that shown in FIG. 1, but showing specific transmission line and adjustable capacitor components.

Shown in FIG. 2 is an example of the present invention in which an extra high frequency signal is added to the probe circuit. This circuit may be for a triple tuned NMR probe that excites, for example, the nuclei $^1H$, $^{13}C$ and $^{15}N$. In such a circuit, the $^1H$ nucleus has a Larmor frequency that is approximately four times higher than that for $^{13}C$, and approximately ten times higher than that for $^{15}N$.

As shown in the figure, the sample coil is connected in series with quarter wavelength resonators 20 and 24, each of which is tuned to the $^1H$ frequency. These resonators are connected, respectively, to quarter wavelength resonators 22 and 26. Resonators 22 and 26 are also tuned to the $^1H$ frequency and have open-ended terminations. In practice, some of the resonator lengths may be absorbed by the sample coil and must be compensated for by adjusting the physical lengths of the lines. With the arrangement shown in FIG. 2, the transmission lines create a standing wave at the $^1H$ frequency that has electrical field maxima at the top end of resonators 20 and 24 and at the bottom end of resonators 22 and 26. Corresponding electric field minima are created at the center of the sample coil 10 and at the electric field nodal points A and B located, respectively, between resonators 20 and 22 and between resonators 24 and 26. These nodal points allow the addition of the $^{13}C$ and $^{15}N$ channels without affecting the $^1H$ resonance. For example, the $^{13}C$ frequency could be inserted at point A, while the $^{15}N$ frequency is inserted at point B.

The symmetry of the sample coil and resonators 20, 22, 24, 26 generates a balanced magnetic field maximum in the center of the sample coil where the sample is excited. The resonant frequency of the sample coil determines a tradeoff between the efficiency of the high frequency (in this case, $^1H$) and the low frequency (in this case, $^{13}C$ and $^{15}N$) channels. Increasing the self-resonance of the sample coil, by reducing its inductance or capacitance, improves the $^1H$ efficiency, while degrading the $^{13}C$ and $^{15}N$ efficiency. Decreasing the self-resonance of the sample coil would have the opposite effect.

The tradeoff discussed above is minimized in the present invention by the use of an impedance component between the nodal points A and B. In the example shown in FIG. 2, the impedance is provided by adjustable capacitor 28. Since the points A and B are electric field minima for the $^1H$ frequency, the potential across the capacitor 28 for the $^1H$ frequency is zero. Thus, the addition of this impedance has no effect on resonant frequency of the probe circuit at the $^1H$ frequency, and the efficiency of $^1H$ frequency signal remains high. However, for the lower frequency nuclei $^{13}C$ and $^{15}N$, the use of the capacitor 28 in parallel with the sample coil gives the circuit a lower resonant frequency. That is, the resonant frequency appears lower to the $^{13}C$ and $^{15}N$ frequencies, despite the fact that the sample coil is unchanged. Thus, the use of the impedance 28 increases the efficiency at the lower frequencies, without detrimentally affecting the efficiency at the $^1H$ frequency.

In the embodiment of FIG. 2, a tunable capacitor is used. One advantage of using a tunable impedance is that is makes it convenient to find the appropriate value to maximize the $^{13}C$ efficiency. Increasing the capacitance provided by capacitor 28 lowers the self-resonance of the sample coil/capacitor combination, thereby improving the efficiencies at both the $^{13}C$ and $^{15}N$ frequencies. However, $^{13}C$ has a higher Larmor frequency than $^{15}N$, and continuing to increase the capacitance value of capacitor 28 would eventually make the resonant frequency of the sample coil/capacitor combination lower than the Larmor frequency of $^{13}C$. At this point, the efficiency of $^{13}C$ begins to degrade (although the efficiency of $^{15}N$ would continue to increase until its own Larmor frequency was reached).

A tunable impedance between the nodes A and B of the FIG. 2 embodiment allows for the relative adjustment of both low frequency channels simultaneously. An example of when this might be useful is when a sample with high dielectric constant is inserted within the sample coil and lowers the resonant frequency of the sample coil too much. The adjusting of the additional impedance could then be used to increase the frequencies of both resonances, which is particularly useful if individual tuning elements of those resonances were limited in range. If, for example, the impedance element is a tunable capacitor like that shown in the figure, the capacitance value of capacitor 28 could be lowered to increase the frequencies of the low frequency channels.

Figure 3:
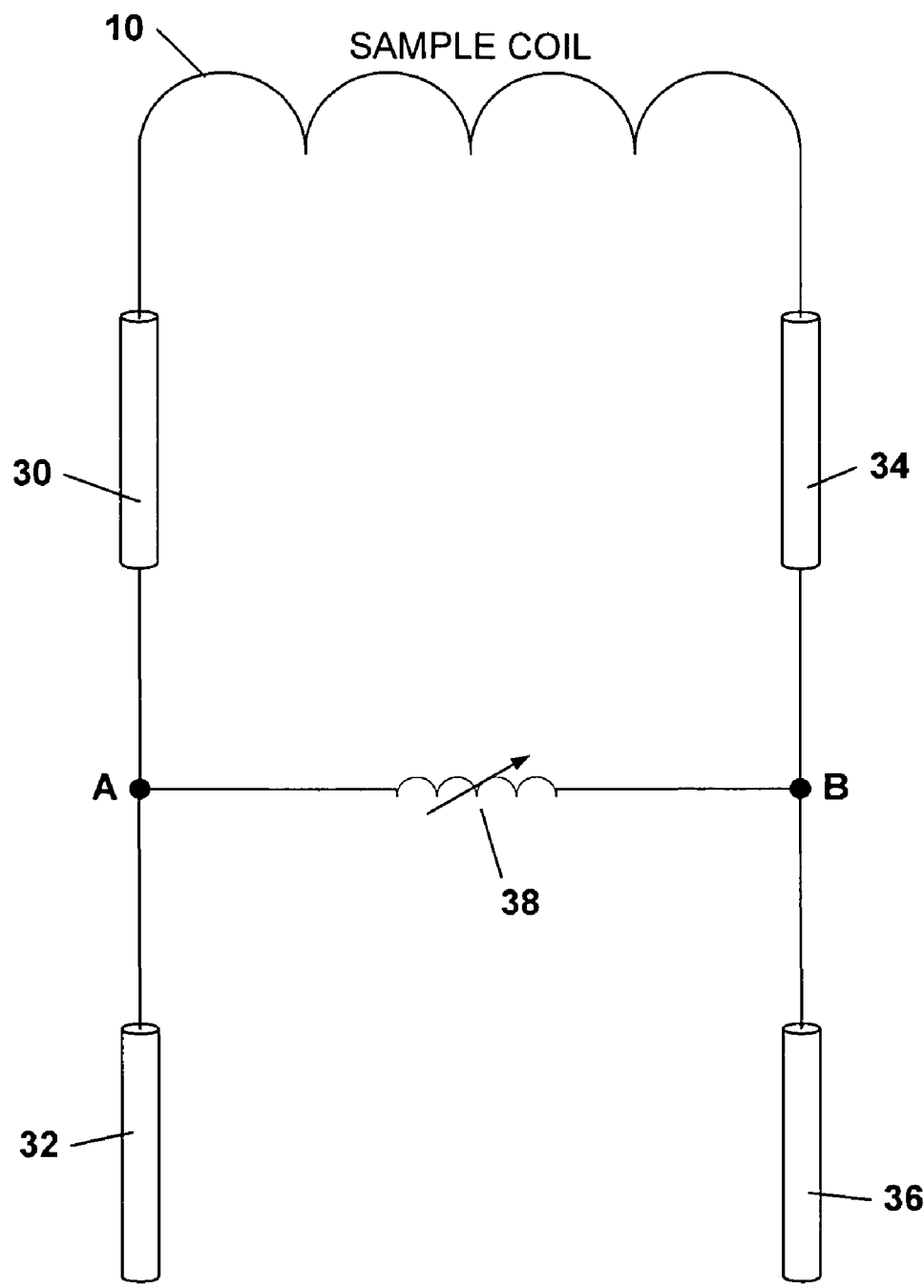
FIG. 3 is a schematic view of a probe circuit like that of FIG. 2, but using an adjustable inductor rather than an adjustable capacitor.

FIG. 3 shows an alternative embodiment of the invention in which an adjustable inductor 38 is used as an impedance between two nodal points A and B. This example depicts a probe circuit for which the efficiency of a low frequency channel is to be maximized. In FIG. 3, each of the components 30, 32, 34, 36 is a quarter wavelength transmission line tuned to the wavelength of the low frequency channel. This, again, produces nodal points at (A and B, respectively) between resonators 30 and 32 and between resonators 34 and 36. A high frequency channel that is not an odd multiple of the low frequency can be inserted at either of the points A and B without affecting the low frequency resonance or efficiency. In order to increase the frequency of the high frequency channel, the inductor 38 can be adjusted accordingly.

It is also possible to use an impedance between the nodal points A and B that is made up of a combination of components. Referring again to FIG. 1, the impedance Z5 could be, for example, a parallel combination of a capacitor and an inductor. Assuming that the quarter wavelength resonators Z1, Z2, Z3 and Z4 are tuned to the high frequency resonance, e.g., that of $^1$H, the nodal points A and B will be electrical iso-points at the $^1$H frequency. Two lower frequencies, such as $^{15}$N and $^{13}$C could be input at $^1$H iso-points, and could be affected by the Z5 impedance. For example, if the self-resonance tuning of Z5 was to a frequency between that of $^{13}$C and $^{15}$N, Z5 would appear as a capacitor to the $^{13}$C channel, and as an inductor to the $^{15}$N channel. This would have the effect of reducing the resonant frequency of the $^{13}$C channel, while increasing the resonant frequency of the $^{15}$N channel. In essence, to any channel that is below the self-resonance frequency of Z5, it will appear as an inductor, and to any channel that is above the self-resonance frequency of Z5, it will appear as a capacitor.

In another example, the resonance Z5 could be a series combination of an inductor and a capacitor. In such an arrangement, any channel having a frequency lower than the self-resonance frequency of Z5 will see Z5 as a capacitor, and any channel having a frequency above the self-resonance frequency of Z5 will see Z5 as an inductor. Thus, in the case of two additional frequencies being $^{13}$C and $^{15}$N, if Z5 has a self-resonance frequency between $^{13}$C and $^{15}$N, it will increase the resonant frequency of the $^{13}$C channel while reducing the resonant frequency of the $^{15}$N channel.

A variety of other impedance networks could be used a Z5, including a series of trap together with a number of capacitors and inductors. Other such arrangements are presumed to be within the scope of the invention. Indeed, those skilled in the art will recognize other types of impedance arrangements that may be connected to electrical iso-points for one particular frequency, so as to affect the other channel frequencies, while having no effect on the particular frequency.

While the invention has been shown and described with reference to preferred embodiments thereof, it will be recognized by those skilled in the art that various changes in form and detail may be made therein without departing from the spirit and scope of the invention as defined by the appended claims.

What is claimed is:

1. A nuclear magnetic resonance probe circuit comprising:
   an inductive sample coil;
   a resonator circuit electrically connected to the sample coil to form a combined circuit that is resonant at frequency $f_1$, the resonator circuit having a plurality of points of electric field minima for an RF signal at the frequency $f_1$;
   an input port connected to a one of said minima points via which an electrical signal at a frequency $f_2$ that is lower than frequency $f_1$ is input to the resonator circuit; and
   an impedance connected between the two of said minima points that significantly modifies the frequency response of the probe circuit at frequency $f_2$, but has a negligible effect on the frequency response of the probe circuit at frequency $f_1$.

2. A probe circuit according to claim 1 wherein the impedance is adjustable.

3. A probe circuit according to claim 2 wherein the impedance comprises an adjustable capacitor.

4. A probe circuit according to claim 2 wherein the impedance comprises an adjustable inductor.

5. A probe circuit according to claim 1 wherein the impedance comprises a parallel combination of at least one inductor and one capacitor.

6. A probe circuit according to claim 1 wherein the impedance comprises a series combination of at least one inductor and one capacitor.

7. A probe circuit according to claim 1 wherein the impedance is electrically in parallel with the sample coil.

8. A probe circuit according to claim 1 wherein the input port is a first input port, and wherein the resonator circuit comprises a second input port connected to a second one of said minima points via which an electrical signal at a frequency $f_3$ is input to the resonator.

9. A probe circuit according to claim 1 wherein the resonator circuit comprises a transmission line.

10. A probe circuit according to claim 9 wherein the transmission line is a first transmission line, and wherein the resonator circuit comprises a plurality of transmission lines separated by said minima.

11. A probe circuit according to claim 1 wherein the resonator circuit is balanced such that an electric field minimum for the frequency $f_1$ is located at the center of the sample coil.

12. A nuclear magnetic resonance probe circuit comprising:
    an inductive sample coil;
    a resonator circuit electrically connected to the sample coil to form a combined circuit that is resonant at frequency $f_1$ and balanced so that a point of electric field minimum is located at a center of the sample coil, the resonator circuit comprising a plurality of transmission lines and having a plurality of additional points of electric field minima for an RF signal at the frequency $f_1$;
    a first input port connected to a first one of said minima points via which an electrical signal at a frequency $f_2$ that is lower than frequency $f_1$ is input to the resonator circuit;
    a second input port connected to a second one of said minima points via which an electrical signal at a frequency $f_3$ that is lower than frequency $f_2$ is input to the resonator circuit; and
    an impedance connected between the first and second minima points that significantly modifies the frequency response of the probe circuit at frequencies $f_2$ and $f_3$, but has a negligible effect on the frequency response of the probe circuit at frequency $f_1$.

13. A method of producing a nuclear magnetic resonance probe circuit having an inductive sample coil and a resonator circuit electrically connected to the sample coil to form a combined circuit that is resonant at a frequency $f_1$, the resonator circuit having a plurality of points of electric field minima for an RF signal at the frequency $f_1$, the method comprising:
    coupling a signal at frequency $f_1$ to the resonator circuit at a point away from said minima points;
    coupling a signal at a frequency $f_2$ that is lower than frequency $f_1$ to the resonator circuit at one of said minima points; and
    providing an impedance connected between two of said minima points that significantly modifies the frequency response of the probe circuit at frequency $f_2$, but has a negligible effect on the frequency response of the probe circuit at frequency $f_1$.

14. A method according to claim 13 wherein the impedance is adjustable, and may be adjusted to change the frequency response of the probe circuit at the frequency $f_2$.

15. A method according to claim 13 wherein the impedance comprises a combination of at least one inductor and one capacitor.

16. A method according to claim 13 wherein the impedance is electrically in parallel with the sample coil.

17. A method according to claim 13 wherein the input port is a first input port, and wherein the resonator circuit comprises a second input port connected to a second one of said minima points via which an electrical signal at a frequency $f_3$ is input to the resonator.

18. A method according to claim 17 wherein the impedance is adjustable, and may be adjusted to change the frequency response of the probe circuit at the frequencies $f_2$ and $f_3$.

19. A method according to claim 13 wherein the resonator circuit comprises a transmission line.

20. A method according to claim 13 wherein the resonator circuit is balanced such that an electric field minimum for the frequency $f_1$ is located at the center of the sample coil.

* * * * *